United States Patent
Montalvo

(10) Patent No.: US 8,106,710 B2
(45) Date of Patent: Jan. 31, 2012

(54) APPARATUS AND METHOD FOR VARIABLE GAIN TRANSCONDUCTANCE

(75) Inventor: Antonio Montalvo, Raleigh, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/726,958

(22) Filed: Mar. 18, 2010

(65) Prior Publication Data

US 2011/0227649 A1   Sep. 22, 2011

(51) Int. Cl.
*H03F 3/45* (2006.01)
(52) U.S. Cl. .......... 330/254; 330/258; 330/261
(58) Field of Classification Search ........... 330/253, 330/254, 258, 261
See application file for complete search history.

(56) References Cited

U.S. PATENT DOCUMENTS

| | | | | |
|---|---|---|---|---|
| 5,077,541 A * | 12/1991 | Gilbert | ............... | 330/284 |
| 6,985,036 B2 * | 1/2006 | Bhattacharjee et al. | ...... | 330/254 |
| 7,109,796 B2 * | 9/2006 | Heigelmayer et al. | ........ | 330/254 |
| 7,560,986 B2 * | 7/2009 | Kocaman | ............... | 330/254 |

OTHER PUBLICATIONS

Barrie Gilbert, The Micromixer: A Highly Linear Variant of the Gilbert Mixer Using a Bisymmetric Class-AB Input Stage, IEEE Journal of Solid-State Circuits, vol. 32, No. 9, Sep. 1997, pp. 1412-1423.

* cited by examiner

*Primary Examiner* — Khanh Nguyen
(74) *Attorney, Agent, or Firm* — Knobbe Martens Olson & Bear LLP

(57) ABSTRACT

The present disclosure describes a variable gain transconductor having gain and/or linearity performance that are selectively controllable in operation. In one embodiment the gain and/or linearity performance are selectively controllable in response to the strength of an input signal, such as an incoming radio frequency (RF) signal to a radio receiver. In one embodiment, gain and/or linearity performance of the variable gain transconductor are selectively controllable by selecting or deselecting a number of operating bias cells. In one embodiment, gain and/or linearity performance of the variable gain transconductor are selectively controllable by selecting or deselecting a number of operating transconductance (gm) cells. In one embodiment, gain and/or linearity performance of the variable gain transconductor are selectively controllable by selecting or deselecting a combination of operating bias cells and gm cells. In one embodiment, the variable gain transconductor is configured to convert single-ended voltage input into a differential current output. In one embodiment, the variable gain transconductor is configured to convert differential voltage input into a differential current output.

20 Claims, 12 Drawing Sheets

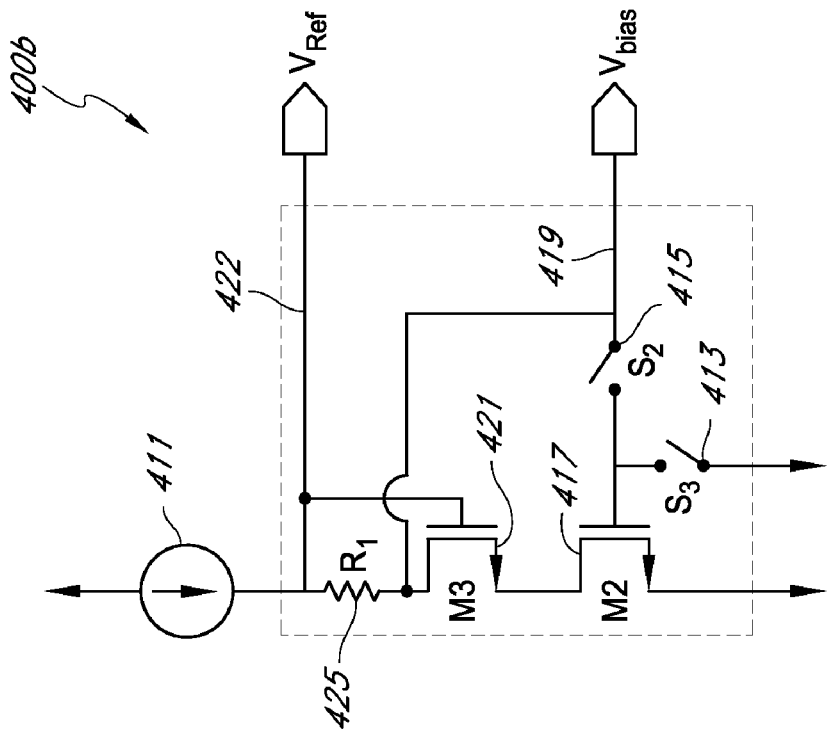
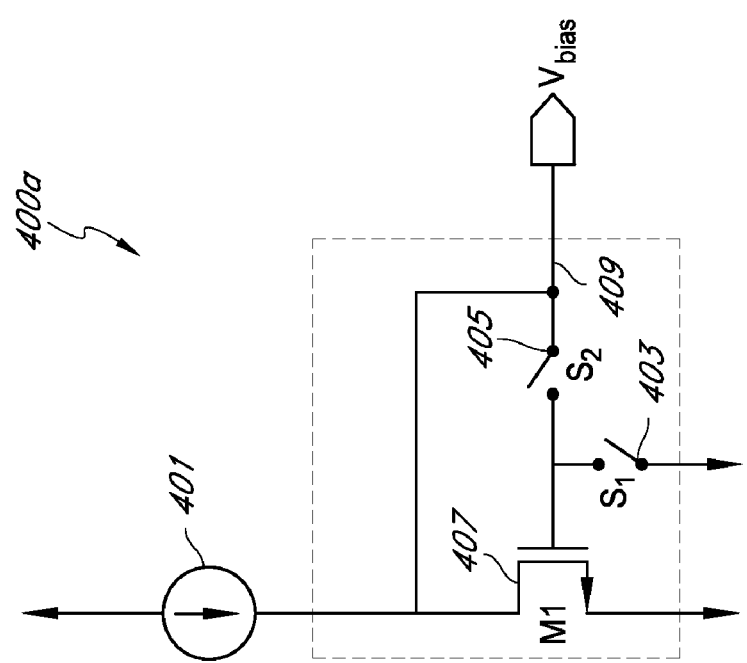
FIG. 4B
FIG. 4A

APPARATUS AND METHOD FOR VARIABLE GAIN TRANSCONDUCTANCE

BACKGROUND

1. Field

Embodiments of the invention relate to electronic devices, and more particularly, in one or more embodiments, to variable gain transconductors.

2. Description of the Related Technology

Wireless systems typically include a radio receiver that processes a wireless signal to recover original information carried by the wireless signal. Radio receiver architectures typically down-convert an incoming radio frequency (RF) signal to a first intermediate frequency (IF) or a baseband signal. For example, in a superheterodyne radio receiver architecture the first IF signal further down-converted either to a second lower IF signal or to the baseband signal. In a direct conversion radio receiver the RF signal is directly converted to the baseband signal that can be processed to extract transmitted information without further down-conversion. As such, direct conversion schemes can be used to eliminate external RF/IF filters and multiple down conversion stages, which can reduce the cost of a radio receiver front end.

Radio receiver architectures of all types are often configured to include a variable gain amplifier. The variable gain amplifier allows the radio receiver to receive incoming RF signals with widely varying power levels. For example, in a wireless system, the difference between strong and weak received signals can be as much as 100 dB. On the one hand, the variable gain amplifier prevents a strong incoming RF signal from saturating radio receiver components, which leads to non-linear distortions of the signal within the radio receiver. Non-linear distortions, such as clipping, lead to processing errors that result in information loss. In a complementary manner, the variable gain amplifier amplifies weak incoming RF signals so that transmitted information can be obtained from the weak signals by the radio receiver.

The variable gain control can be implemented before or after down-conversion. Prior to down-conversion, variable gain control is typically implemented in a low noise amplifier (LNA). After down-conversion, variable gain control is typically implemented in a transimpedance amplifier (TIA). Both of these options have drawbacks. For example, for a variable gain LNA, decreasing the gain improves linearity but also increases the noise figure of the entire radio receiver, since the LNA typically dominates the noise performance in a radio receiver. By contrast, while reducing the gain of a TIA does not significantly degrade noise performance, decreasing the gain in the TIA does not significantly improve the overall linearity of the radio receiver.

Additionally, since antennas typically have single-ended outputs, it is preferable for the input of the component following the antenna in a radio receiver to be single-ended as well. However, in a direct conversion radio receiver, singled-ended signals are susceptible to even order distortion, which is a form of non-linear distortion that degrades performance. One solution is to use a balun prior to the LNA. The balun may be either on the same IC as the LNA of off chip. Another solution is to convert a signal-ended signal to a differential signal within the LNA of the radio receiver. This typically involves using inductors that increase the complexity and component count of a radio receiver. For fully integrated radio receivers, on-chip inductors occupy valuable space and induce parasitic substrate interference signals in the form of eddy currents that degrade performance of other components. Off-chip inductors add to the size, component count, heat dissipation and overall cost of a radio receiver.

SUMMARY

Various embodiments of systems, methods and devices within the scope of the appended claims each have several aspects, no single one of which is solely responsible for the desirable attributes described herein. Without limiting the scope of the appended claims, some prominent features are described herein. After considering this discussion, and particularly after reading the section entitled "Detailed Description" one will understand how the features of various embodiments are used to manage wireless network resources at base stations and/or femto nodes.

One aspect of the disclosure is an apparatus including a biasing circuit having a first bias output, and a transconductor cell array comprising two or more transconductor cells in parallel with each other. The transconductor cell array is responsive to voltage at a first input, wherein the transconductor cell array is configured to generate a differential output current at a first current output and a second current output, wherein at least one of the transconductor cells is selectively activatable via a first control input to alter the transconductance gain of the transconductor cell array, wherein a biasing input of the transconductor cell array is coupled to the first bias output of the biasing circuit for transconductance gain control of active transconductor cells. In one embodiment the biasing circuit includes two or more bias cells in parallel with each other, wherein at least one of the bias cells is selectively activatable via a second control input to alter a bias level produced by the biasing circuit, wherein altering the bias level alters both gain and linearity.

Another aspect of the disclosure is a method including providing a transconductor cell array comprising two or more transconductor cells in parallel with each other, wherein the transconductor cell array is responsive to voltage at an input, wherein the transconductor cell array is configured to generate a differential output current at a first current output and a second current output. The method also includes selectively controlling activation of at least one of the transconductor cells to alter the transconductance gain of the transconductor cell array. The method also includes controlling a bias level provided to a biasing input of the transconductor cell array for transconductance gain control of active transconductor cells. In one embodiment, the method also includes providing a bias cell array comprising two or more bias cells in parallel with each other, and selectively controlling activation of at least one of the bias cells to alter the bias level, wherein altering the bias level alters both gain and linearity.

BRIEF DESCRIPTION OF THE DRAWINGS

FIG. 4A is a schematic diagram of one embodiment of a bias cell.

FIG. 4B is a schematic diagram of another embodiment of a bias cell.

DETAILED DESCRIPTION OF EMBODIMENTS

The various embodiments of systems, methods, and devices described herein each have several aspects, no single one of which is solely responsible for the desirable attributes described. Without limiting the scope of the claims, the more prominent features of various embodiments are described below. After considering the following one will understand how the features of the various embodiments provide advantages over other transconductors and radio receivers previously available.

Overview of Radio Receiver

Figure 1:
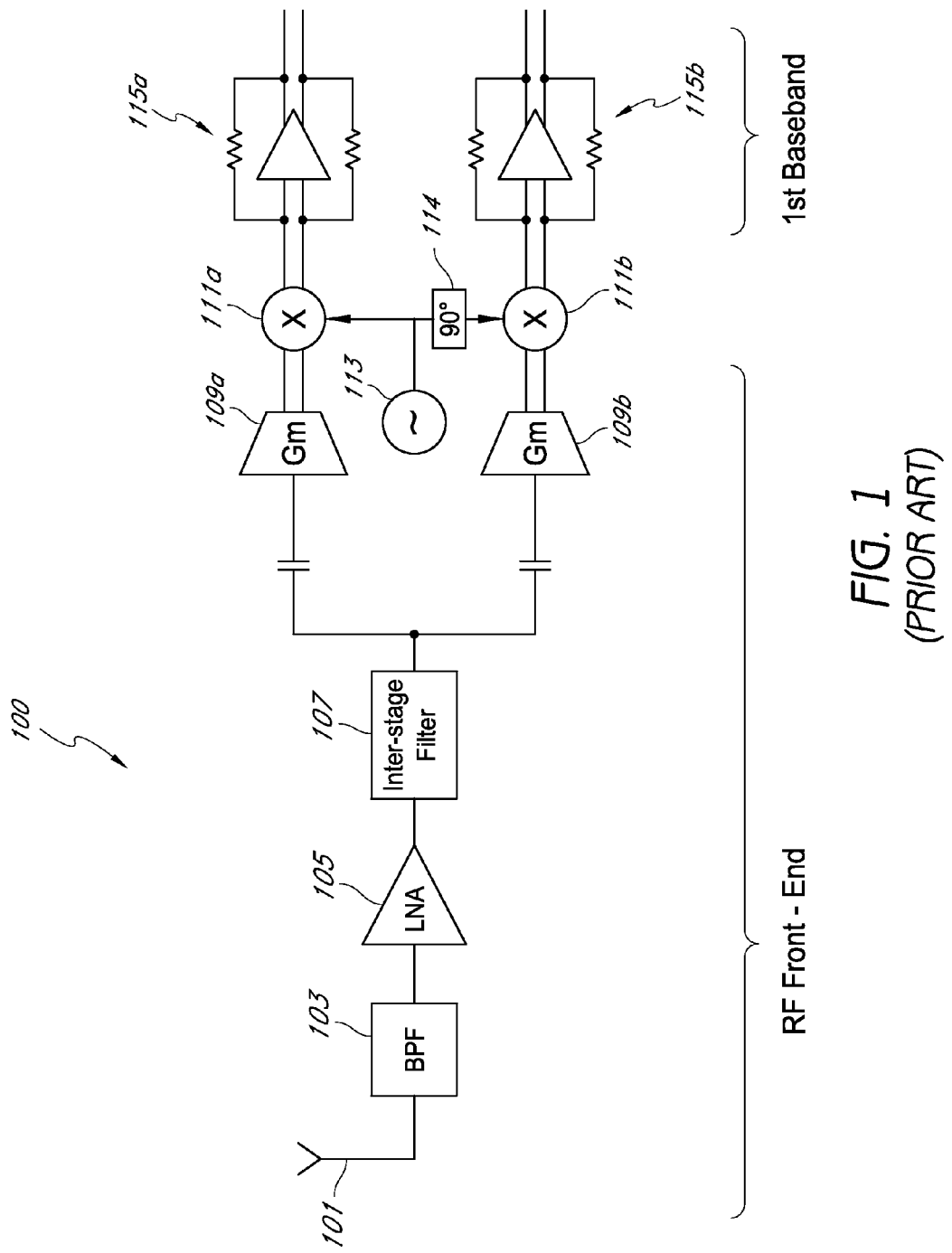
FIG. 1 is a block diagram of a portion of a conventional radio receiver.

FIG. 1 is a block diagram of a portion of a prior art radio receiver 100. The radio receiver 100 includes an antenna 101, an optional band-pass filter (BPF) 103, a low noise amplifier (LNA) 105 and an inter-stage filter 107 respectively connected in series. Following the inter-stage filter 107, the radio receiver 100 includes two parallel branches that are provided to process in-phase (I) and quadrature (Q) components of an incoming RF signal. The first branch includes a first transconductor 109a, a first mixer 111a, and a first transimpedance amplifier (TIA) 115a respectively connected in series. The second branch includes a second transconductor 109b, a second mixer 111b, and a second TIA 115b respectively connected in series. The radio receiver 100 also includes a local oscillator (LO) 113 and a phase-shift circuit 114. The LO 113 is directly coupled to the first mixer 111a, and coupled through the phase-shift circuit 114 to the second mixer 111b.

The LNA 105 and/or the first and second TIAs 115a, 115b are typically configured to provide variable gain amplification in response to the relative strength of incoming RF signals. Equipping the radio receiver 100 with a variable gain LNA 105 and/or variable gain first and second TIAs 115a, 115b allows the radio receiver 100 to receive incoming RF signals with widely varying power levels. For example, in a wireless system the difference between strong and weak received signals can be as much as 100 dB. On the one hand, a variable gain amplifier prevents a strong incoming RF signal from saturating radio receiver components, which leads to non-linear distortions of the signal within the radio receiver. Non-linear distortions, such as clipping, lead to processing errors that result in information loss that reduces the quality of communication. In a complementary manner, a variable gain amplifier amplifies weak incoming RF signals so that transmitted information can be obtained from weak signals by the radio receiver.

However, both variable gain LNAs and TIAs have drawbacks. For example, for a variable gain LNA 105, dynamically decreasing the gain improves linearity but also increases the noise figure of the entire radio receiver 100, since the LNA 105 typically dominates the noise performance. By contrast, dynamically reducing the gain of the first and second TIAs 115a, 115b does not significantly degrade noise performance, but neither does it significantly improve the linearity of the radio receiver 100.

Additionally, since antennas typically have single-ended outputs, it is preferable for the input of the component following the antenna (for example, the BPF 103 or the LNA 105) in the radio receiver 100 to be single-ended as well. However, in a direct conversion radio receiver, singled-ended signals are susceptible to even order distortion, which is a form of non-linear distortion that degrades performance.

A typical solution is to convert a single-ended signal to a differential signal within the LNA 105 of the radio receiver 100. However, this typically includes using inductors in the design of the LNA 105. On-chip inductors occupy a large die space and induce parasitic substrate interference signals in the form of eddy currents that degrade performance of other components. Off-chip inductors add to the size, component count, heat dissipation and overall cost of the radio receiver 100. Therefore, there is a need for a scheme that can provide increased gain and improved linearity and noise performance while reducing die area used for implementation.

Variable Gain Transconductor

In some embodiments, variable gain transconductors having selectively controllable gain and/or linearity performance are provided. In one embodiment, the gain and/or linearity performance are selectively controllable in response to the strength of an input signal, such as an incoming radio frequency (RF) signal to a radio receiver. In one embodiment, the gain and/or linearity performance of a variable gain transconductor are selectively controllable by selecting or deselecting one or more bias cells. In one embodiment, the gain and/or linearity performance of a variable gain transconductor are selectively controllable by selecting or deselecting one or more transconductance (gm) cells. In one embodiment, the gain and/or linearity performance of a variable gain transconductor are selectively controllable by selecting or deselecting a combination of one or more bias cells and one or more transconductance cells.

In one embodiment, a variable gain transconductor is configured to convert a single-ended voltage input into a differential current output. In one embodiment, a variable gain transconductor is configured to convert a differential voltage input into a differential current output. A variable gain transconductor can be embodied within a radio receiver. A variable gain transconductor can be embodied within a direct conversion radio receiver. A variable gain transconductor can alternatively be embodied within a superheterodyne radio receiver. Additionally, various embodiments of a variable gain transconductor can either be fully or partially integrated onto a single semiconductor chip. Those skilled in the art will also appreciate that an embodiment of a variable gain transconductor can be adapted for operating within any type of communications receiver or as a module or a component within another type of electronic system or sub-system where dynamic voltage-to-current conversion can be usefully employed.

Figure 2:
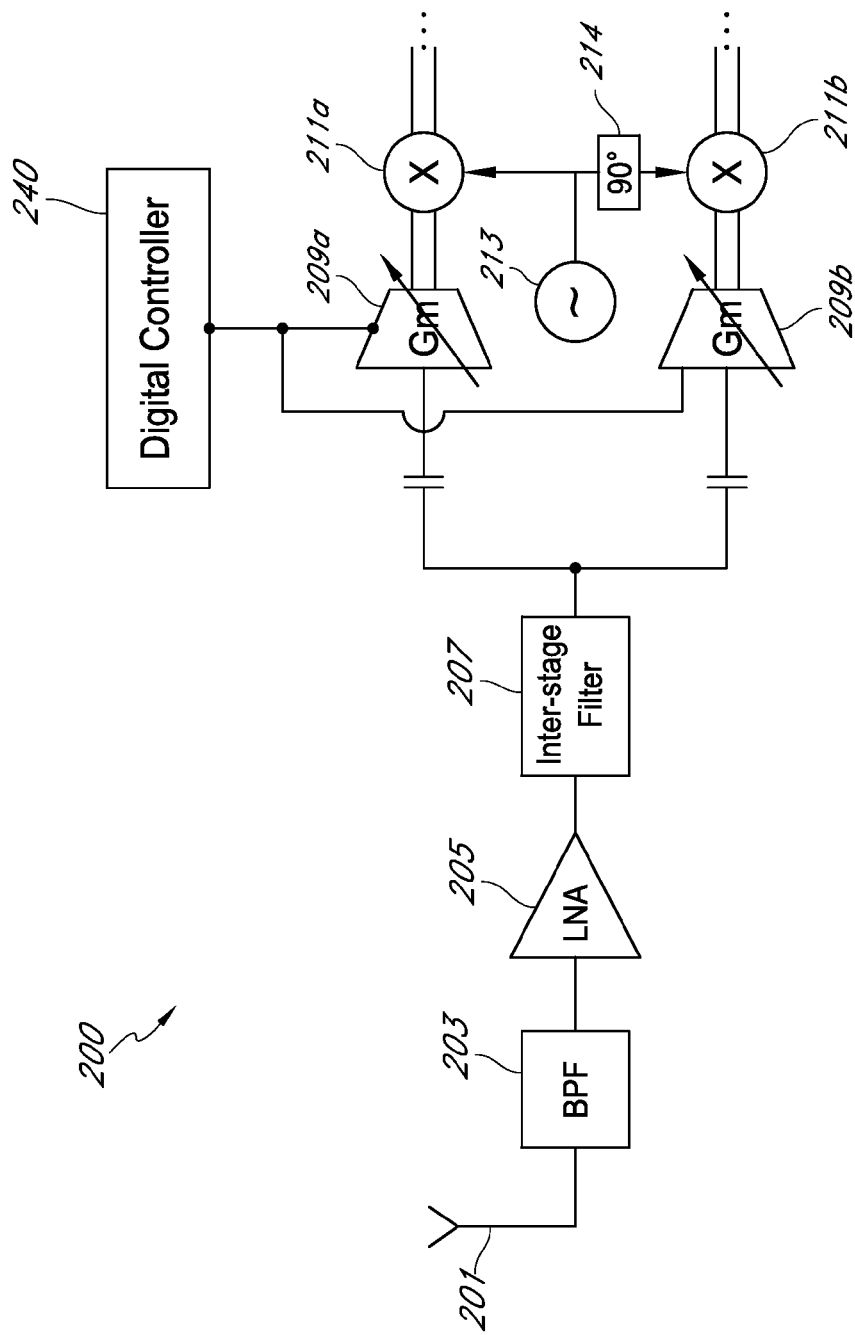
FIG. 2 is a block diagram of one embodiment of a portion of a radio receiver.

FIG. 2 is a block diagram of an embodiment of a portion of a radio receiver 200 including an embodiment of variable gain transconductor which includes first and second variable gain transconductors 209a, 209b. The portion of the radio receiver 200 can be either utilized in a direct conversion radio receiver architecture or utilized as a first down-conversion stage in an alternative architecture, such as for example, a superheterodyne architecture.

The radio receiver 200 includes an optional BPF 203, an LNA 205 and an optional inter-stage filter 207 respectively connected in series. Following the inter-stage filter 207, the radio receiver 200 includes two parallel branches configured to process in-phase (I) and quadrature (Q) components of an incoming RF signal. The first branch includes a first variable gain transconductor 209a, and a first mixer 211a respectively connected in series. The second branch includes a second variable gain transconductor 209b, and a second mixer 211b respectively connected in series. The radio receiver 200 also includes a local oscillator (LO) 213 and a phase-shift circuit 214. The LO 213 is coupled to the first mixer 211a, and coupled through the phase-shift circuit 214 to the second mixer 211b. The radio receiver 200 also includes a digital controller 240 that is coupled to the first and second variable gain transconductors 209a, 209b in order to provide control signals to the first and second variable gain transconductors 209a, 209b.

In operation, an RF signal is initially received by an antenna 201, which is coupled to an input of the radio receiver 200. In one embodiment, the RF signal is coupled to the optional BPF 203 which acts to limit the band of RF wavelengths that are processed by the radio receiver 200. In one embodiment, the RF signal is substantially centered at an RF carrier with a frequency $f_{RF}$. In one embodiment, the BPF 203 suppresses or attenuates out-of-band RF power so that the out-of-band RF power has a substantially negligible effect on the operation of the radio receiver 200. In another embodiment, the RF signal is coupled to the LNA 205 from the antenna 201 (in other words, the BPF 203 is not required), and the LNA 205 is designed to be band-limited, and thus substantially prevents out-of-band RF power from reaching the other components of the radio receiver 200.

The primary functions of the LNA 205 are to amplify the received RF signal and set the noise figure within the radio receiver 200. Those skilled in the art will appreciate that the noise figure for cascaded components is dominated by the first component providing substantial positive gain. Accordingly, even in the presence of the antenna 201 and the optional BPF 203, the noise figure (F) of the radio receiver 200 can be approximated by equation (1).

$$F \approx 1 + \frac{N_{LNA}}{N_{IN} G_{LNA}} \quad (1)$$

In equation (1), $N_{IN}$ is the received noise component of the received RF signal; $N_{LNA}$ is the noise added by the LNA 205; and, $G_{LNA}$ is the gain provided by the LNA 205.

The amplified RF signal produced by the LNA 205 is coupled to the optional inter-stage filter 207. The inter-stage filter 207 operates to suppress RF power in a band around and including the image frequency so that that RF power is not also down-converted to the IF by the first and second mixers 211a, 211b. The image frequency band and the desired frequency band are separated by twice the IF frequency ($f_{IF}$) and are respectively located on either side of the operating frequency of the LO (in other words, $f_{LO}-f_{IF}$ and $f_{LO}+f_{IF}$). For example, if a low-side LO is used for down-conversion, the image frequency will be approximately $f_{LO}-f_{IF}$. If a high-side LO is used, the image frequency will be approximately $f_{LO}+f_{IF}$.

The first and second variable gain transconductors 209a, 209b convert the amplified and filtered RF signal from a voltage signal into differential current signals for respective in-phase and quadrature component processing. In other words, the first and second variable gain transconductors 209a, 209b are configured to operate as voltage controlled current sources. The switch from a voltage signal to a current signal is desirable for down-conversion because current-mode mixers provide relatively good performance. Moreover, as described in greater detail below, the first and second variable gain transconductors 209a, 209b also provide selectively controllable gain and/or linearity performance. The digital controller 240 provides respective control signals to the first and second variable gain transconductors 209a, 209b that are used to selectively control the gain and/or linearity performance of the first and second variable gain transconductors 209a, 209b.

As noted above, for performance reasons, the first and second mixers 211a, 211b are preferably current-mode mixers. The first and second mixers 211a, 211b down-convert the RF signal (at $f_{RF}$) to respective in-phase and quadrature IF signals (at $f_{IF}$) by multiplying the LO signal (at $f_{LO}$) with the RF signal. The second mixer 211b uses a LO signal that has been phase-shifted by 90 degrees ($\pi/2$) by the phase-shifter 214. The in-phase and quadrature IF signals are then coupled to other components (not shown) for further processing. For example, in one embodiment, respective first and second TIAs (not shown) receive the respective in-phase and quadrature IF signals from the respective first and second mixers 211a, 221b. The first and second TIAs convert the respective in-phase and quadrature IF signals from current signals to voltage signals.

Figure 3A:
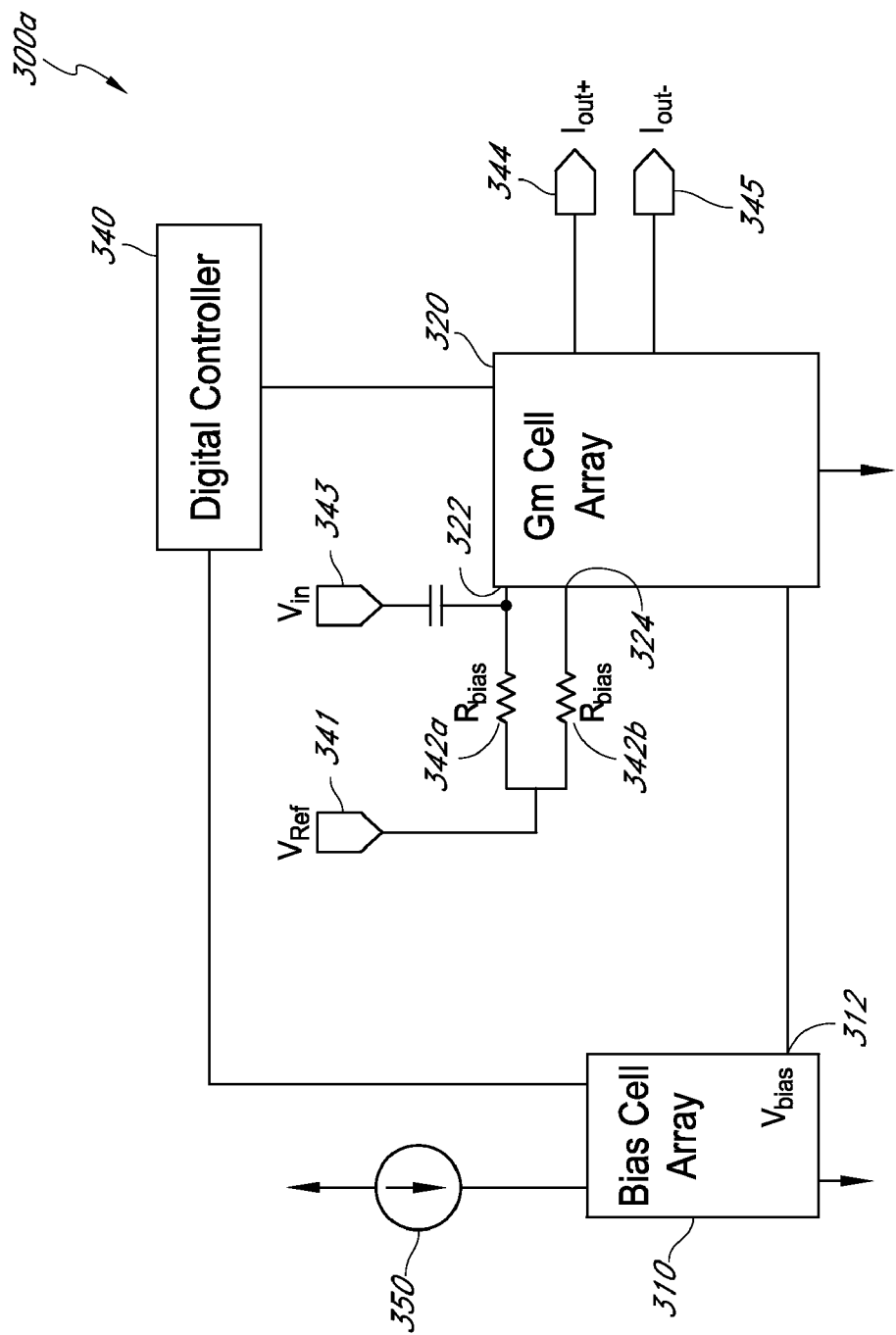
FIG. 3A is a block diagram of one embodiment of a variable gain transconductor.

FIG. 3A is a schematic block diagram of an embodiment of a variable gain transconductor 300a in combination with a digital controller 340. The illustrated variable gain transconductor 300a can be used in, for example, an RF receiver. For example, the configuration of the variable gain transconductor 300a of FIG. 3A can be adapted for either or both of the first and second variable gain transconductor 209a, 209b of FIG. 2.

The illustrated variable gain transconductor 300a includes a bias cell array 310 and a transconductance (gm) cell array 320. The bias cell array 310 and the transconductance cell array 320 are coupled to the digital controller 340. The bias cell array 310 is also coupled to a current source 350, and includes a voltage bias ($V_{bias}$) output connection 312 that is coupled to the transconductance cell array 320. The variable gain transconductor 300a includes first and second input connections 341 and 343 that are ultimately coupled to respective first and second input connection 322, 324b of the transconductance cell array 320. The first input connection 341 is coupled to first and second bias resistors 342a, 342b that are coupled in parallel to the transconductance cell array 320. The second input connection 343 is coupled via a capacitor to a node between the first bias resistor 342a and the transconductance cell array 320. The transconductance cell array 320 includes first and second output connections 344 and 345.

In operation, the bias cell array 310 provides at least a voltage bias $V_{bias}$ to the transconductance cell array 320. The first input connection 341 receives a voltage reference $V_{Ref}$, and the second input connection 343 receives an input voltage signal $V_{in}$, that is converted into a differential current output $I_{out+}$, $I_{out-}$ by the transconductance cell array 320. The differential current $I_{out+}$, $I_{out-}$ is provided from the combination of the first and second output connections 344, 345, respectively.

Also in operation, the digital controller 340 provides control signals CS1, CS2 to at least one of the bias cell array 310 and the transconductance cell array 320. As described in further detail below, the control signals CS1, CS2 are used to select and deselect a combination of one or more bias cells (not shown in FIG. 3A) in the bias cell array 310 and one or more transconductance cells (not shown in FIG. 3A) in the transconductance cell array.

Generally, increasing the current density through the bias cells of the bias cell array 310, by turning off or deselecting one or more operating bias cells, substantially increases the voltage bias $V_{bias}$. In turn, the gain of the first variable gain transconductor 300a increases in response to increases in the voltage bias $V_{bias}$. Conversely, the gain of the first variable gain transconductor 300a decreases in response to decreases in the voltage bias $V_{bias}$, caused by turning on or selecting one or more non-operating bias cells. On the other hand, turning off or deselecting one or more operating transconductance cells of the transconductance cell array 320, will substantially decrease the gain of the first variable gain transconductor 300a, but will not substantially impact the linearity, unless there is a change in the number of operating bias cells. Conversely, the gain of the first variable gain transconductor 300a increases in response to turning on or selecting one or more non-operating transconductance cells. Linearity of the first variable gain transconductor 300a increases in response to increases in current density through operating bias cells, and decreases in response to decreases in current density through operating bias cells.

Figure 3B:
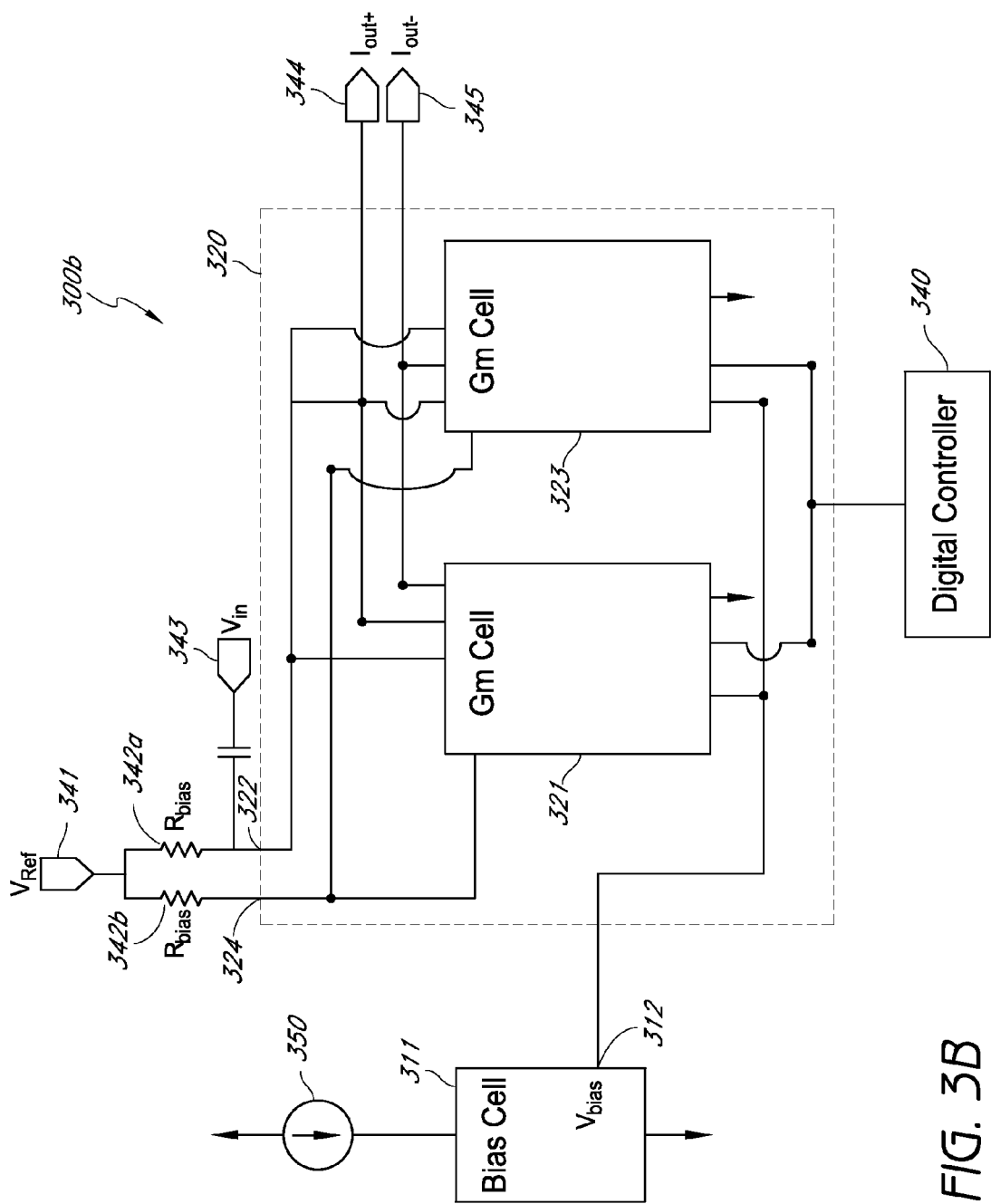
FIG. 3B is a block diagram of another embodiment of a variable gain transconductor.

FIG. 3B is a schematic block diagram of another embodiment of a variable gain transconductor 300b in combination with the digital controller 340. The illustrated variable gain transconductor 300b can be used in, for example, an RF receiver. For example, the configuration of the variable gain transconductor 300b of FIG. 3B can be adapted for either or both of the first and second variable gain transconductor 209a, 209b of FIG. 2.

The illustrated variable gain transconductor 300b is similar to and adapted from the variable gain transconductor 300a of FIG. 3A. Accordingly, elements common to the variable gain transconductors 300a, 300b of FIGS. 3A and 3B share common reference indicia, and only differences between the variable gain transconductors 300a, 300b of FIGS. 3A and 3B are described herein for the sake of brevity. Among other differences, the variable gain transconductor 300b of FIG. 3B has a single bias cell 311 whereas the variable gain transconductor 300a of FIG. 3A has a bias cell array including a plurality of bias cells.

The transconductance cell array 320 illustrated in FIG. 3B includes a plurality of transconductance cells. For example, the transconductance cell array 320 includes two cells: first and second transconductance cells 321, 323. The first and second transconductance cells 321, 323 are coupled in parallel to one another. The first and second transconductance cells 321, 323 are coupled to the voltage bias ($V_{bias}$) output connection 312 of the bias cell 311.

The variable gain transconductor 300b of FIG. 3B includes only one bias cell 311. Accordingly, the gain of the second variable gain transconductor 300b is adjusted by selective control of the first and/or second transconductance cells 321, 323. While only two transconductance cells 321, 323 are illustrated in FIG. 3B, a transconductance cell array can be configured to include any number of transconductance cells that can be turned on/off (in other words, selected or deselected) in order to adjust the gain of a variable gain transconductor.

Generally, reducing the number of operating transconductance cells 321, 323 decreases the gain of the second variable gain transconductor 300b. Conversely, the gain of the second variable gain transconductor 300b increases in response to increasing the number of operating transconductance cells 321, 323, caused by turning on one or more non-operating transconductance cells 321, 323.

Figure 3C:
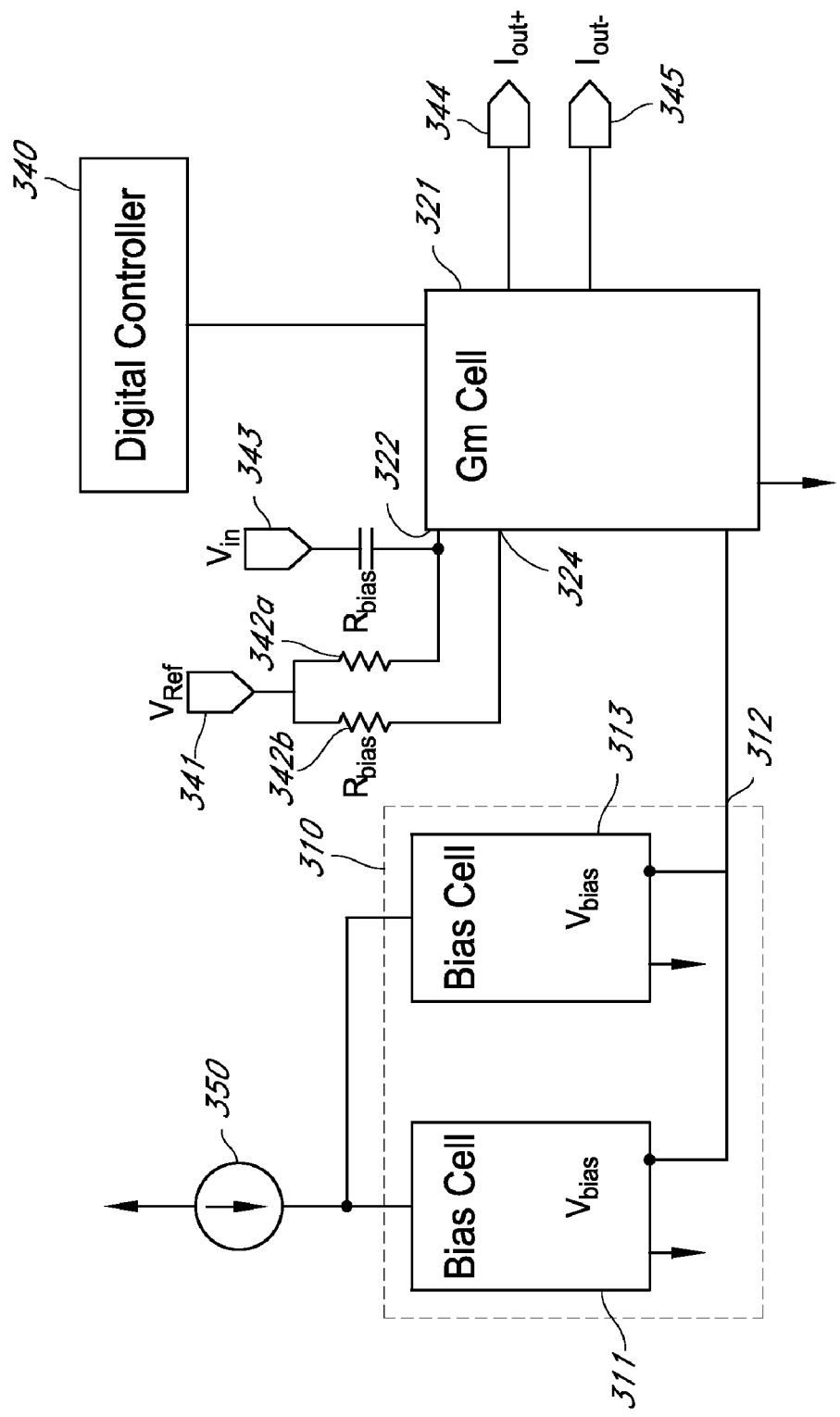
FIG. 3C is a block diagram of yet another embodiment of a variable gain transconductor.

FIG. 3C is a schematic block diagram of yet another embodiment of a variable gain transconductor 300c in combination with the digital controller 340. The illustrated variable gain transconductor 300c can be used in, for example, an RF receiver. For example, the configuration of the variable gain transconductor 300c of FIG. 3C can be adapted for either or both of the first and second variable gain transconductor 209a, 209b of FIG. 2. In certain embodiments, a combination of any two of the variable gain transconductors 300a-300c of FIGS. 3A-3C can be adapted for the first and second variable gain transconductor 209a, 209b of FIG. 2.

The variable gain transconductor 300c of FIG. 3C is similar to and adapted from the variable gain transconductor 300a of FIG. 3A. Accordingly, elements common to the variable gain transconductors 300a, 300c of FIGS. 3A and 3C share common reference indicia, and only differences between the variable gain transconductors 300a, 300c of FIGS. 3A and 3C are described herein for the sake of brevity. Among other differences, the variable gain transconductor 300c of FIG. 3C has a single transconductance cell 321 whereas the variable gain transconductor 300a of FIG. 3A has a transconductance cell array including a plurality of transconductance cells.

The bias cell array 310 of FIG. 3C includes a plurality of bias cells. For example, the bias cell array 310 includes two cells: first and second bias cells 311, 313. The first and second bias cells 311, 313 are coupled to the current source 350 in parallel to one another. The first and second bias cells 311, 313 are coupled to the voltage bias ($V_{bias}$) output connection 312 of the bias cell array 310 in order to set the voltage bias in operation.

The variable gain transconductor 300c of FIG. 3C includes only one transconductance cell 321. Accordingly, the gain and/or linearity performance of the third variable gain transconductor 300c are adjusted by selective control of the first and second bias cells 311, 313. While only two bias cells 311, 313 are illustrated in FIG. 3C, a bias cell array can be configured to include any number of bias cells that can be turned on/off (in other words, selected or deselected) in order to adjust the gain and/or linearity performance of an embodiment of a variable gain transconductor.

Generally, increasing the current density through the bias cells 311, 313 substantially increases the voltage bias $V_{bias}$. In turn, the gain of the third variable gain transconductor 300c increases in response to increases in the voltage bias $V_{bias}$. Conversely, the gain of the third variable gain transconductor 300c decreases in response to decreases in the voltage bias $V_{bias}$, caused by turning on one or more non-operating bias cells 311, 313.

FIG. 4A is a schematic diagram of one embodiment of a bias cell 400a. The bias cell 400a includes a NMOS transistor 407, and first and second switches 403, 405. The drain of the transistor 407 is coupled to a node 409 and to a current source 401. The node 409 is selectively connectable to the gate of the transistor 407 through the second switch 405. The gate of the transistor 407 is also selectively connectable to ground through the first switch 403. The source of the transistor 407 is electrically coupled to ground. A skilled artisan will appreciate that the bias cell 400a can be modified to have the NMOS transistor 407 replaced with a PMOS transistor or a bipolar transistor.

In operation, the voltage bias $V_{bias}$ is provided from the node 409. The switches 403, 405 operate in response to control signals from a controller, for example, the digital controller 240 of FIG. 2. In an "on" or "selected" state, the first switch 403 is open and the second switch 405 is closed. As a result, the first bias cell 400a functions as half of a current mirror with the corresponding other half integrated into the transconductance cells (not shown). In an "off" or "deselected" state, the first switch 403 is closed and the second switch 405 is open. As a result, the transistor 407 is off (in other words, non-conducting) and is substantially an open circuit. Thus, the first bias cell 400a does not provide a voltage bias or draw a substantial amount of current from the current source 401.

FIG. 4B is a schematic diagram of an embodiment of a second bias cell 400b configured to provide both the aforementioned voltage bias ($V_{bias}$) and the reference voltage ($V_{Ref}$). The second bias cell 400b includes first and second NMOS transistors 417, 421, a resistor 425 and first and second switches 413, 415. The resistor 425 is coupled between a current source 411 and the drain of the second transistor 421 at node 422. The gate of the second transistor 421 is also coupled to node 422. The source of the second transistor 421 is coupled to the drain of the first transistor 417. Node 419 is selectively connectable to the gate of the first transistor 417 through the second switch 415. The gate of the first transistor 417 is also selectively connectable to ground through the first switch 413. The source of the first transistor 417 is electrically coupled to ground. Node 419 is also coupled to the drain of the second transistor 421. A skilled artisan will appreciate that the bias cell 400b can be modified to have the NMOS transistors 417, 425 replaced with PMOS transistors or bipolar transistors.

In operation, the aforementioned voltage bias $V_{bias}$ is provided from the second node 419 and the reference voltage $V_{Ref}$ is provided from node 422. In an "on" or "selected" state, the first switch 413 is open and the second switch 415 is closed. As a result, the second bias cell 400b functions as half of a current mirror with the corresponding other half integrated into the transconductance cells (not shown). In an "off" or "deselected" state, the first switch 413 is closed and the second switch 415 is open. As a result, the first transistor 417 is off (in other words, non-conducting) and is substantially an open circuit. Thus, the second bias cell 400b does not provide a voltage bias or a reference voltage, and does not draw a substantial amount of current from the current source 411.

Figure 5:
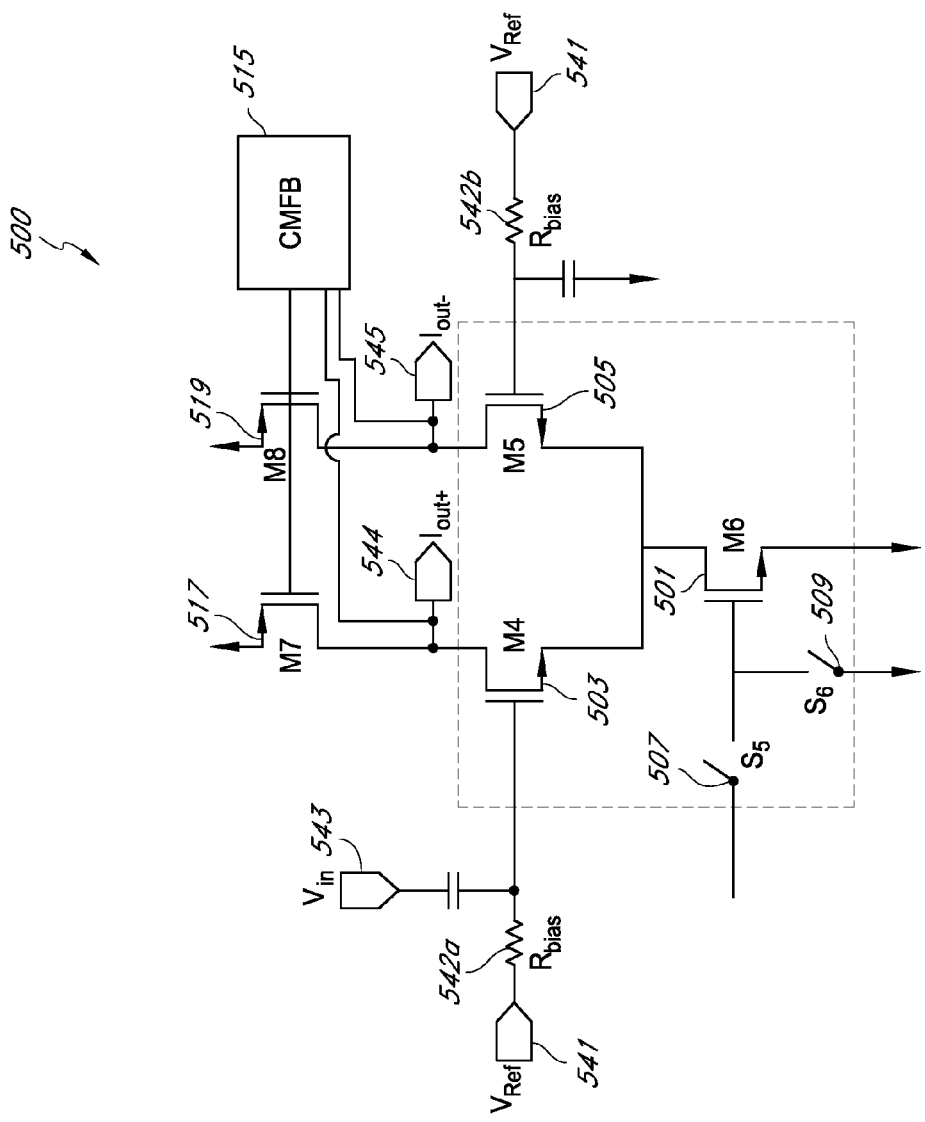
FIG. 5 is a schematic diagram of one embodiment of a transconductance cell.

FIG. 5 is a schematic diagram of an embodiment of a transconductance cell 500. The transconductance cell 500 includes first, second and third NMOS transistors 501, 503 and 505, and first and second switches 507 and 509. The second and third transistors 503, 505 form a differential pair. The respective drains of the second and third transistors 503, 505 are respectively coupled to the first and second output connections 544, 545. The respective sources of the second and third transistors 503, 505 are coupled to the drain of the first transistor 501.

The first switch 507 selectively connects the gate of the first transistor 501 to the aforementioned voltage bias from the bias cell array (not shown). The second switch 509 selectively connects the gate of the first transistor 501 to ground.

A first bias resistor 542a is coupled between the gate of the second transistor 503 and a first input connection 541. A second input connection 543 is coupled between the first bias resistor 542a and the gate of the second transistor 503. A second bias resistor 542b is coupled between the gate of the third transistor 505 and the first input connection 541. The gate of the third transistor 505 is also coupled to analog ground.

Fourth and fifth (PMOS) transistors 517, 519 are coupled between the respective drains of the second and third transistors 503, 505 and a top rail voltage. The gates of the fourth and fifth transistors 517, 519 are controlled by a common mode feedback module (CMFB) 540. The CMFB module 540 has inputs $I_{out+}$ and $I_{out-}$. The common mode component of the voltage on the current signals $I_{out+}$ and $I_{out-}$ (i.e. $(V(I_{out+})+V(I_{out-}))/2$) is compared to a reference voltage that is either generated inside the CMFB module 540 (e.g., Vdd/2) or delivered into the CMFB module 540 via an additional input connection. The CMFB module 540 adjusts the gate voltage of the fourth and fifth transistors 517 and 519 such that the common mode component of $I_{out+}$ and $I_{out-}$ is equal to the reference voltage.

In operation, the first and second switches 507, 509 are used to control whether the transconductance cell is "on" or "off". In an "off" or "deselected" state, the first switch 507 is open and the second switch 509 is closed. In turn, the first transistor 501 is "off" and operating current is not drawn through the transconductance cell 500.

In an "on" or "selected" state, the first switch 507 is closed and the second switch 509 is open. In turn, the voltage bias from the bias cell array turns on the first transistor 501, and an operating current is drawn through the transconductance cell 500 from the fourth and fifth transistors 517, 519, which operate as current sources for the transconductance cell 500. The first input connection 541 receives the DC reference voltage. The second input connection receiver the analog (or RF) voltage ($V_{in}$), which is converted to a contribution of the differential current output $I_{out+}$, $I_{out-}$ of an embodiment of a variable gain transconductor, when the transconductance cell 500 is in an "on" state.

In one embodiment, the impedance looking into the drain of the first transistor 501 is high, so that the transconductance of the circuit is approximately Gm≈gm, wherein gm is the approximate transconductance of each of the second and third transistors 503, 505. However, in embodiments where the impedance looking into the drain of the first transistor 501 is not very high, the differential current output $I_{out+}$, $I_{out-}$ may be unbalanced, which may result in undesired amplitude modulation (AM) detection. In one embodiment, the AM detection can be suppressed by AC coupling into an adequately designed mixer core (not shown), which is not described herein. Alternatively, in one embodiment balance of the differential current output $I_{out+}$, $I_{out-}$ is improved by configuring the transconductance cell 500 to receive a differential voltage input, which is described below in greater detail with reference to FIG. 10.

Figure 6:
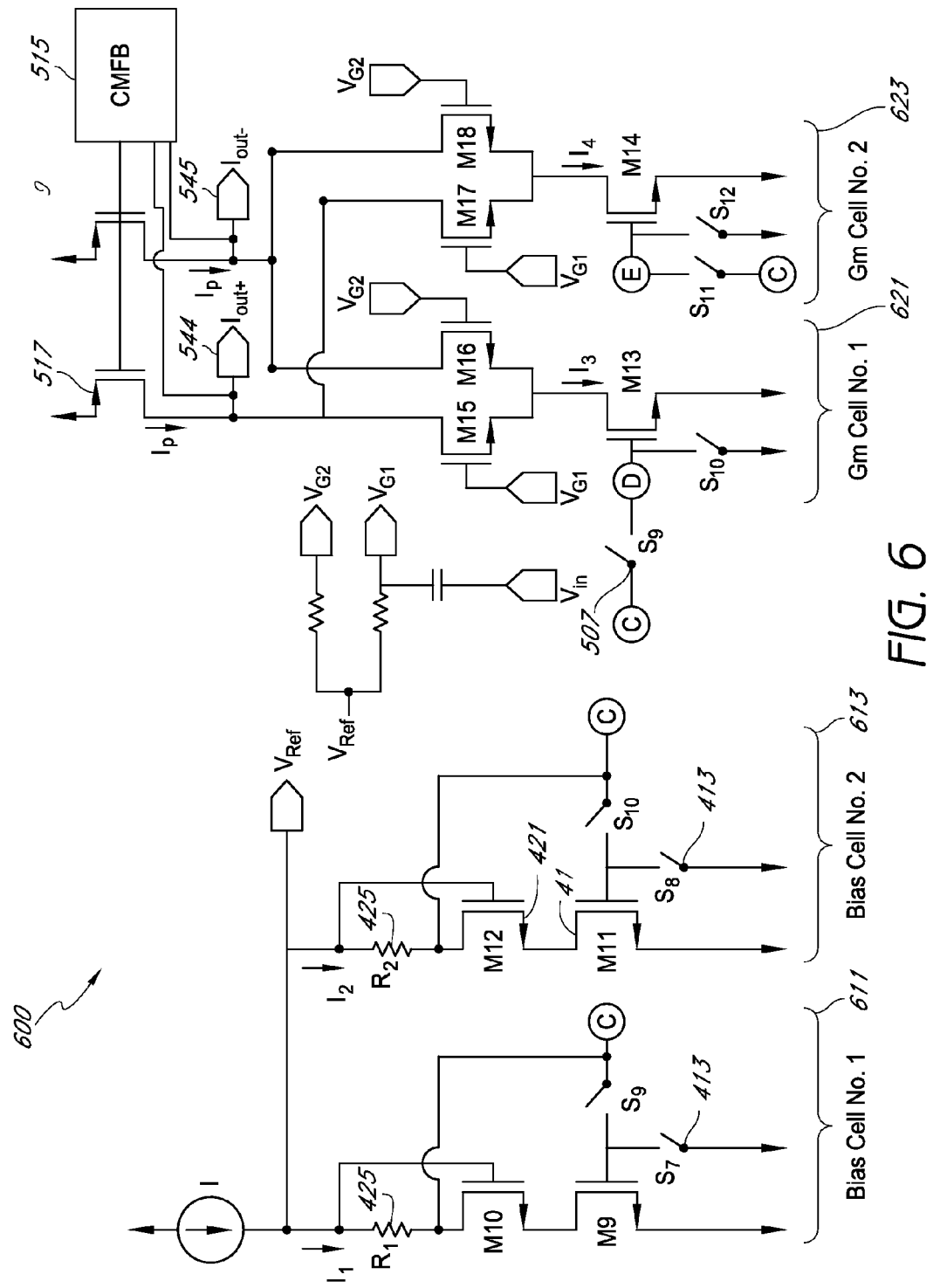
FIG. 6 is a schematic diagram of one embodiment of a variable gain transconductor.

FIG. 6 is a schematic diagram of an embodiment of a variable gain transconductor 600 including a bias cell array and a transconductance cell array. In the illustrated embodiment, the bias cell array includes first and second bias cells 611, 613. The transconductance cell array includes first and second transconductance cells 621, 623. While only two bias cells 611, 613 and two transconductance cells 621, 623 are illustrated in FIG. 6, a variable gain transconductor can be configured to include any number of bias cells and any number of transconductance cells, which can each be turned on/off (in other words, selected or deselected) in order to adjust the gain and/or linearity performance. FIG. 6 is provided to merely illustrate prominent aspects of various embodiments of a variable gain transconductor.

The first and second bias cells 611, 613, are the same as the second bias cell 400b illustrated in FIG. 4B. Accordingly, the first and second bias cells 611, 613 are provided with the same reference indicia as the second bias cell 400b described in detail above, and only differences relating to the combined operation of the first and second bias cells 611, 613 are described herein for the sake of brevity. Similarly, the first and second transconductance cells 621, 623, can be the same as the transconductance cell 500 illustrated in FIG. 5. Accordingly, the first and second transconductance cells 621, 623 are provided with the same reference indicia as the transconductance cell 500 described in detail above, and only differences relating to the combined operation of the first and second transconductance cells 621, 623 are described herein for the sake of brevity.

As described above, with reference to FIG. 3A, increasing the current density through the first and second bias cells 611, 613, by turning off one or more of the first and second bias cells 611, 613, substantially increases the voltage bias $V_{bias}$. For example, when both the first and second bias cells 611, 613 are in an "on" state the respective operating currents $I_1$, $I_2$ are equal to one another, and each of the respective operating currents $I_1$, $I_2$ is equal to one-half of the current I provided by the current source 411. If the first bias cell 611 is turned off, $I_1$ goes to zero and $I_2$ doubles to I, which in turn increases the voltage bias $V_{bias}$.

Generally, for m-number of operating bias cells, the current through each is approximately equal to I/m. Turning one operating bias cell off, increases the current through each of the operating bias cells to I/(m−1). On the other hand, turning another bias cell on, decreases the current through each of the operating bias cells to I/(m+1). The total number of bias cells, n, in a bias cell array sets the number of possible levels for $V_{bias}$ that can be output to the transconductance cell array. For n-number of total bias cells, there are (n−1) non-zero values of $V_{bias}$ that could be used to adjust the gain of an embodiment of a variable gain transconductor.

The gain of the variable gain transconductor 600 increases in response to increases in the voltage bias $V_{bias}$. Conversely, the gain of the variable gain transconductor 600 decreases in response to decreases in the voltage bias $V_{bias}$, caused by turning on or selecting one or more operating bias cells.

On the other hand, turning off one or more operating transconductance cells 621, 623, will substantially decrease the gain of the variable gain transconductor 600. Conversely, the gain of the variable gain transconductor 600 increases in response to turning on one or more transconductance cells. The current through each transconductor cell 621, 623 is equal to the reference current I provided by current source 401 multiplied by the number of operating bias cells ($N_{bias}$) multiplied by the ratio $W_{13}/W_9$, where $W_9$ is the gate width of M9 and $W_{13}$ is the gate width of M13 (given that M9 and M11 are substantially equivalent and that M13 and M14 are substantially equivalent). Disabling an operating transconductor cell does not substantially change the current through the remaining transconductor cells that continue to operate.

Since the transconductor cells 621, 623 illustrated use CMOS transistors, to a first order the transconductance (gm) of each can be approximated by equation (2) as follows:

$$g_m = \sqrt{2 \cdot \frac{\mu \cdot C_{ox} \cdot W}{L} \cdot I_d} \quad (2)$$

In equation (2), μ is the channel carrier mobility; $C_{ox}$ is the capacitance associated with the gate dielectric; $I_d$ is the drain current; and, W/L is the width to length ratio of a MOS transistor. The drain current $I_d$ is a function of the bias voltage $V_{bias}$ provided by the bias cell array. As such, at least as a first order estimate, equation (2) provides a model for the mechanism by which the bias cell array controls the transconductance (gm) produced by each transconducor cell 621, 623.

Generally, for y-number of operating transconductance cells, the total transconductance can be approximated by y*gm. Turning one operating transconductance cell off, decreases the transconductance (gain) (y−1)*gm. On the other hand, turning another transconductance cell on increases the transconductance cells to (y+1)*gm. The total number of transconducatance cells, z, in a transconductor cell array in combination with the total number of bias cells, n, sets the number of possible discrete levels for gain that can be produced by the variable gain transconductor. For z-number of total transconductance cells and n-number of total bias cells, there are (z−1)(n−1) non-"off"-state gain levels. Again, as noted above with reference to FIG. 3A, linearity of the variable gain transconductor 600 increases in response to increases in current density in the bias cell array, and decreases in response to decreases in current density in the bias cell array.

The linearity of a CMOS differential pair is a complicated function of $V_{gs}$–$V_T$. Again, as a first order estimate, the current $I_d$ can also be approximated by equation (3) as follows.

$$I_d = \frac{\mu \cdot C_{ox} \cdot W}{L}(V_{gs} - V_T)^2 \quad (3)$$

Equation (3) can be re-written as follows, $$V_{gs} - V_T = \sqrt{\frac{I_d}{\mu \cdot C_{ox} \cdot W/L}} \quad (3a)$$

Generally, increasing the drain current $I_d$, increases $V_{gs}$–$V_T$ which in turn improves linearity.

Figure 7:
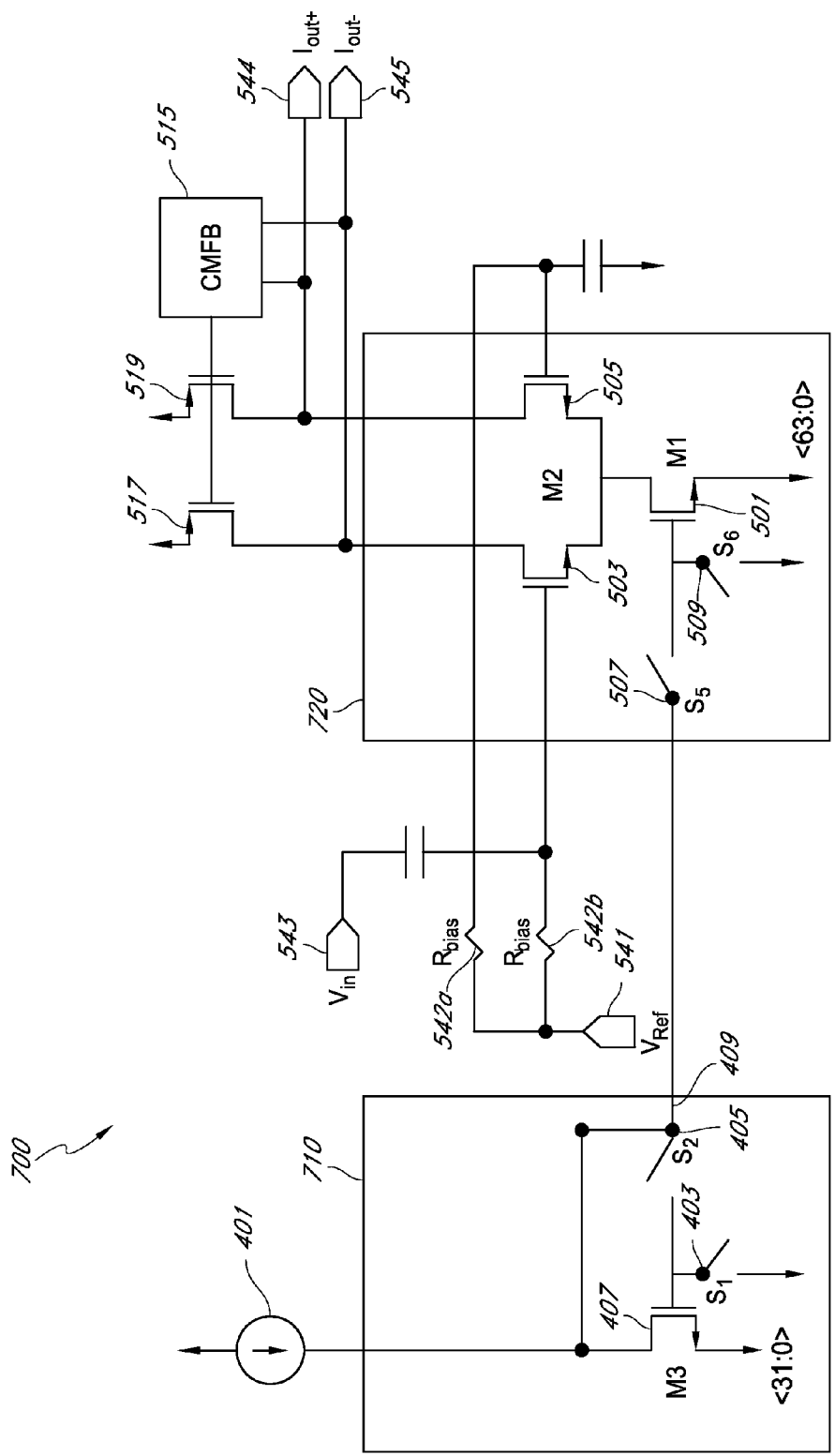
FIG. 7 is a schematic diagram of another embodiment of a variable gain transconductor.

FIG. 7 is a schematic diagram of an embodiment of a variable gain trancsonductor 700. The variable gain transconductor 700 includes a bias cell array 710 and a transconductance cell array 720. The bias cell array 710 includes 32 instances of the first bias cell 400a illustrated in FIG. 4A. Accordingly, the same reference indicia used above to describe the first bias cell 400a shown in FIG. 4A are also used within the bias cell array 710 to describe the 32 constituent bias cells. Similarly, the transconductance cell array 720 includes 64 instances of the transconductance cell 500 illustrated in FIG. 5. Accordingly, the same reference indicia used above to describe the transconductance cell 500 shown in FIG. 5 are also used within the transconductance cell array 720 to describe the 64 constituent transconductance cells. Only differences relating to the combined operation of the first bias cell 400a and the transconductance cell 500 are described herein for the sake of brevity.

Again, the gain and/or linearity performance of the variable gain transconductor 700 are selectively controllable by selecting or deselecting a combination of one or more bias cells and one or more transconductance cells included in the respective bias cell array 710 and transconductance cell array 720. Table 1.0 provides the gain as a function of the number of bias cells and transconductance cells operating in combination.

TABLE 1.0

Variable Gain Response

| Desired Gain (dB) | gm cells | Bias cells |
|---|---|---|
| 0 | 64 | 32 |
| −0.25 | 60 | 30 |
| −0.5 | 57 | 29 |
| −0.75 | 54 | 27 |
| −1 | 51 | 26 |
| −1.25 | 48 | 24 |
| −1.5 | 45 | 23 |
| −1.75 | 43 | 22 |

TABLE 1.0-continued

Variable Gain Response

| Desired Gain (dB) | gm cells | Bias cells |
|---|---|---|
| −2 | 40 | 20 |
| −2.25 | 38 | 19 |
| −2.5 | 36 | 18 |
| −2.75 | 34 | 17 |
| −3 | 32 | 16 |
| −3.25 | 30 | 15 |
| −3.5 | 29 | 15 |
| −3.75 | 27 | 14 |
| −4 | 25 | 13 |
| −4.25 | 24 | 12 |
| −4.5 | 23 | 12 |
| −4.75 | 21 | 11 |
| −5 | 20 | 10 |
| −5.25 | 19 | 10 |
| −5.5 | 18 | 9 |
| −5.75 | 17 | 9 |
| −6 | 16 | 8 |
| −9 | 11 | 8 |
| −12 | 8 | 8 |

Figure 8:
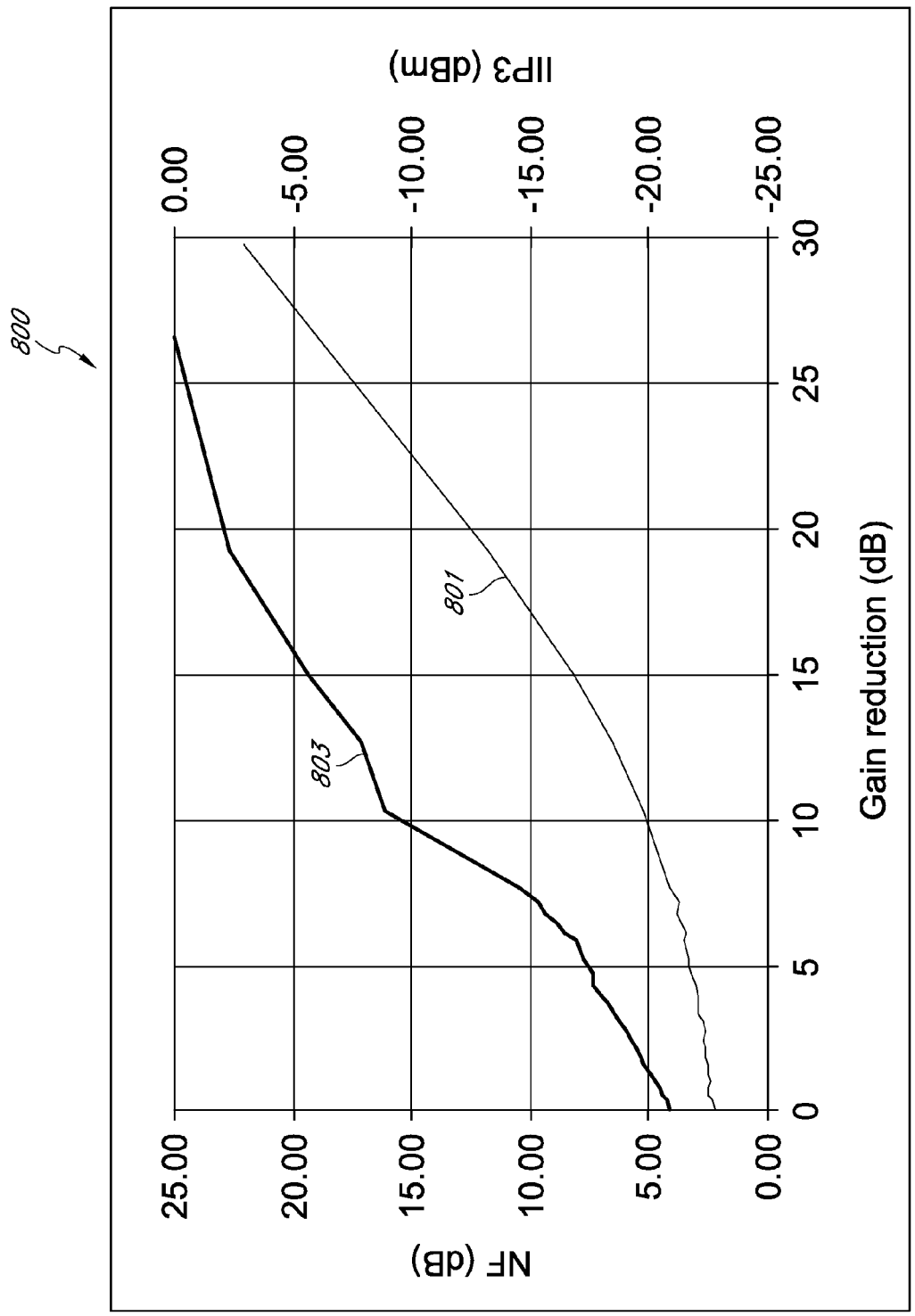
FIG. 8 is a graphical representation of the noise and linearity performance of one embodiment of a variable gain transconductor.

FIG. 8 is a graphical representation of the noise and linearity performance of an embodiment of a variable gain transconductor generally indicated by 800. The noise performance, indicated by 801, shows that the noise figure increases as gain increases, and decreases and gain decreases. Conversely, the linearity performance (IIP3), indicated by 803, shows that the linearity decreases as gain increases, and increases and gain decreases. Another desirable characteristic of embodiments of a variable gain transconductor is that power dissipation is reduced as gain is reduced because inactive bias cells and inactive transconductance cells are turned off, and thus do not draw operating power.

Figure 9:
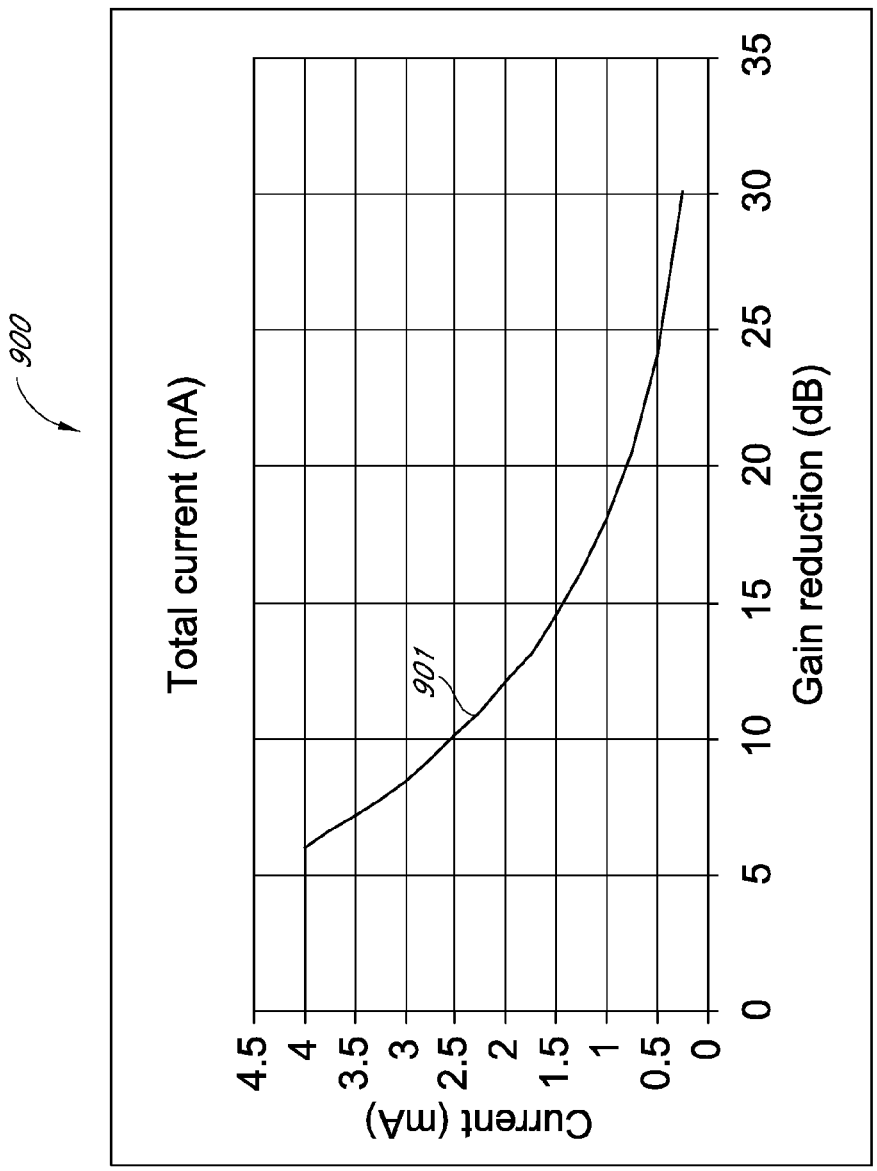
FIG. 9 is a graphical representation of the current drawn by one embodiment of a variable gain transconductor.

FIG. 9 is a graphical representation of the aggregate current drawn by an embodiment of a variable gain transconductor. The aggregate current drawn, indicated by 803, shows that the aggregate current drawn increases as gain increases, and decreases and gain decreases.

Figure 10:
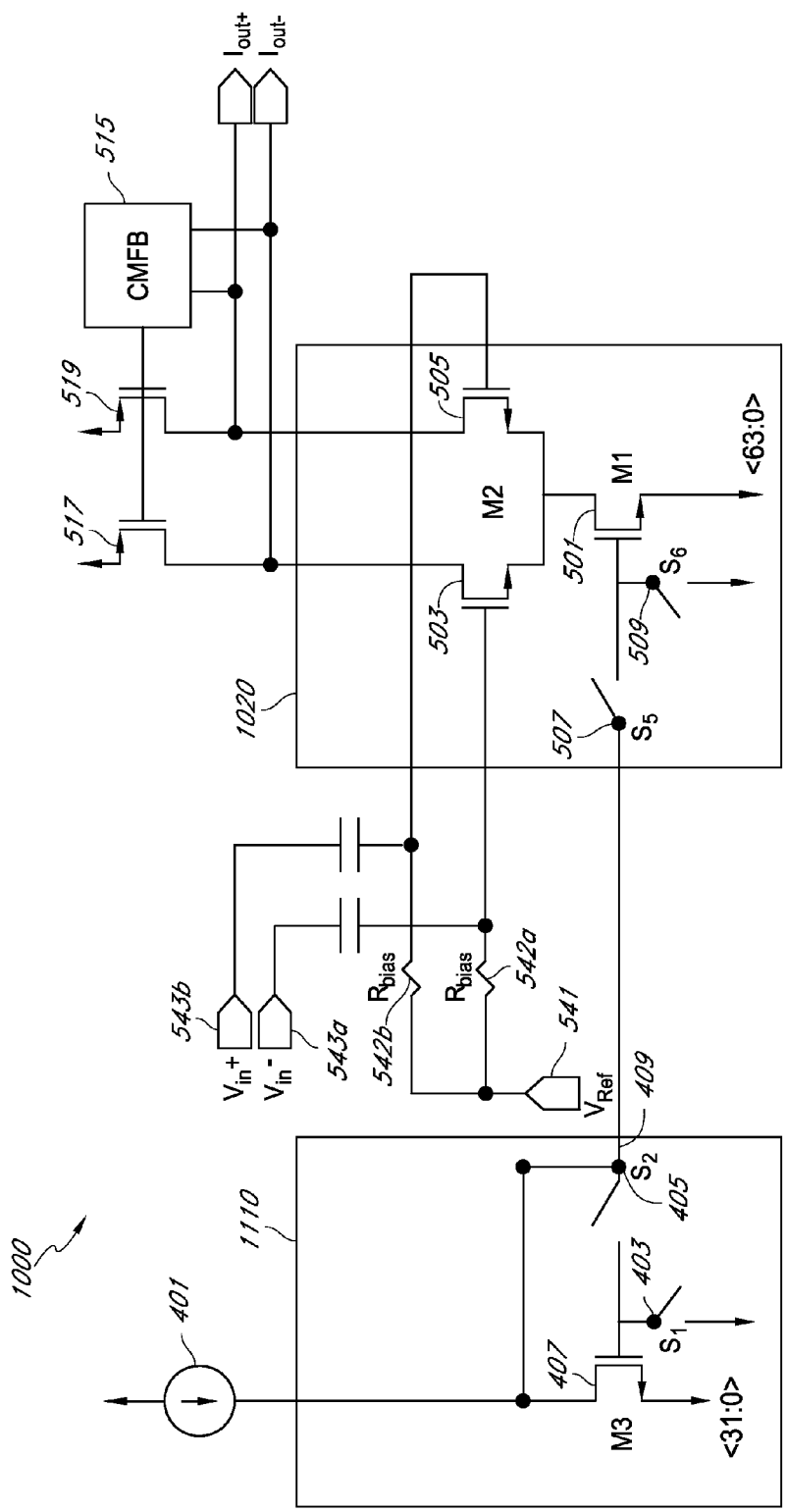
FIG. 10 is a schematic diagram of another embodiment of a variable gain transconductor.

FIG. 10 is a schematic diagram of an embodiment of a variable gain transconductor 1000 configured to receive a differential input voltage signal $V_{in+}$, $V_{in-}$. The variable gain transconductor 1000 is similar to and adapted from the variable gain transconductor 700 illustrated in FIG. 7. Accordingly, elements common to both variable gain transconductors 700, 1000 share common reference indicia, and only differences between the variable gain transconductors 700, 1000 are described herein for the sake of brevity.

The variable gain transconductor 1000 includes first and second input connections 543a, 543b. The first input connection 543a is coupled between the first bias resistor 542a and the gate of the transistor 503. The second input connection 543b is coupled between the second bias resistor 542b and the gate of the transistor 505. In operation, a balanced differential input voltage signal $V_{in+}$, $V_{in-}$ improves the balance of the differential current output $I_{out+}$, $I_{out-}$.

Numerous inventive principles have been described above, and each has independent utility. In some cases, additional benefits and advantages are realized when the principles are utilized in various combinations with one another. For example, various embodiments of individual variable gain transconductors have been described above. Elements of these individual embodiments, however, may be combined to form a radio receiver as shown in FIG. 2. Such a radio may be implemented according to the principles and advantages of the embodiments to provide a direct conversion receiver, a superheterodyne receiver or another type of receiver.

Some of the embodiments disclosed herein have been described with specific signals implemented as current-mode or voltage mode signals, but the inventive principles also contemplate other types of signals, whether characterized as voltages or currents. Likewise, some semiconductor devices are described as being specifically NPN or PNP BJTs, but in many cases different polarities or different device types such as J-FETs or CMOS transistors can also be utilized.

Moreover, the foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

In the embodiments described above, the circuits were described in connection with a radio receiver. The radio receiver employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, cellular base stations, a telephone, a television, a computer monitor, a computer, a hand-held computer, a personal digital assistant (PDA), a stereo system, a cassette recorder or player, a DVD player, a CD player, a VCR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

Thus, the embodiments described herein can be modified in arrangement and detail without departing from the scope of the appended claims. So although specific embodiments have been described, other embodiments will be apparent to those of ordinary skill in the art from the disclosure herein. For example, a skilled artisan will recognize from the disclosure herein that various methods of manufacture, design, and materials can be used to make the various components described herein. For example, a person of ordinary skill in the art would understand that the optional voltage converter can be further adapted to provide an output analog voltage signal proportional to any number of different continuous time varying physical parameters. Additionally, other combinations, omissions, substitutions and modifications will be apparent to the skilled artisan in view of the disclosure herein. It is contemplated that various aspects and features of the invention described can be practiced separately, combined together, or substituted for one another, and that a variety of combination and sub-combinations of the features and aspects can be made and still fall within the scope of the invention. Furthermore, the systems described above need not include all of the modules and functions described in the preferred embodiments. Accordingly, the present invention is not intended to be limited by the recitation of the specific embodiments described above, but is to be defined by reference to the appended claims.

What is claimed is:

1. An apparatus comprising:
a biasing circuit comprising two or more bias cells electrically connected in parallel, the two or more bias cells connected to a first bias output node; and
a transconductor cell array comprising two or more transconductor cells in parallel with each other, wherein the transconductor cell array is responsive to voltage at a first input, wherein the transconductor cell array is configured to generate a differential output current at a first current output and a second current output, wherein at least one of the transconductor cells is selectively activateable via a first control input to alter the transconductance gain of the transconductor cell array, wherein a biasing input of the transconductor cell array is coupled to the first bias output node of the biasing circuit for transconductance gain control of active transconductor cells,
wherein one or more bias cells are selectively activateable in response to one or more second control inputs such that a magnitude of voltage and/or current at the first bias output node varies in relation to a number of the bias cells that are activated.

2. The apparatus of claim 1, wherein altering a bias level of the first bias output node alters both gain and linearity of the transconductor cell array.

3. The apparatus of claim 2, wherein activation of an inactive bias cell increases the gain of the transconductor cell array and deactivation of an active bias cell decreases the gain of the transconductor cell array.

4. The apparatus of claim 1, wherein activation of an inactive transconductor cell decreases the gain of the transconductor cell array and deactivation of an active transconductor cell increases the gain of the transconductor cell array.

5. The apparatus of claim 1, wherein the biasing circuit is configured to generate a voltage level output at the first bias output node.

6. The apparatus of claim 1, wherein the biasing circuit is configured to generate a current level output at the first bias output node.

7. The apparatus of claim 1, wherein the biasing circuit further comprises a second bias output.

8. The apparatus of claim 7, wherein the biasing circuit is configured to generate a voltage level output at the second bias output.

9. The apparatus of claim 7, wherein the biasing circuit is configured to generate a current level output at the second bias output.

10. The apparatus of claim 1, wherein the transconductor cell array further comprises a plurality of switches configured to activate or deactivate transconductor cells, wherein the switches are operable in response to the first control input.

11. The apparatus of claim 2, wherein the biasing circuit further comprises a plurality of switches configured to activate or deactivate bias cells, wherein the switches are operable in response to the second control input.

12. The apparatus of claim 11, wherein each bias cell comprises two switches and a transistor, wherein the two switches are configured to selectively connect the transistor to the first bias output node.

13. The apparatus of claim 1, wherein each transconductor cell comprises two switches and a transistor, wherein the two switches are configured to selectively connect the transistor to the first bias output node of the biasing circuit.

14. The apparatus of claim 1, wherein each transconductor cell comprises a differential pair of transistors, wherein the differential pair is connectable to the first and second outputs.

15. The apparatus of claim 1, wherein the transconductor cell array includes a second input, wherein the transconductor cell array is configured to generate a differential output current from a differential voltage input.

16. An apparatus comprising:
a biasing circuit having a first bias output;
a transconductor cell array comprising two or more transconductor cells in parallel with each other, wherein the transconductor cell array is responsive to voltage at a first input, wherein the transconductor cell array is configured to generate a differential output current at a first current output and a second current output, wherein at least one of the transconductor cells is selectively activateable via a first control input to alter the transconductance gain of the transconductor cell array, wherein a biasing input of the transconductor cell array is coupled to the first bias output of the biasing circuit for transconductance gain control of active transconductor cells, wherein each transconductor cell comprises a differential pair of transistors, wherein the differential pair is connectable to the first and second outputs;
a common mode feedback circuit; and
a pair of current sources connectable to the common mode feedback circuit, wherein the common mode feedback circuit is configured to regulate the current sources.

17. The apparatus of claim 16, wherein each of the pair of current sources comprises a p-type metal oxide semiconductor transistor.

18. An apparatus comprising:
a biasing circuit having a first bias output;
a transconductor cell array comprising two or more transconductor cells in parallel with each other, wherein the transconductor cell array is responsive to voltage at a first input, wherein the transconductor cell array is configured to generate a differential output current at a first current output and a second current output, wherein at least one of the transconductor cells is selectively activateable via a first control input to alter the transconductance gain of the transconductor cell array, wherein a biasing input of the transconductor cell array is coupled to the first bias output of the biasing circuit for transconductance gain control of active transconductor cells; and
a digital controller, wherein the digital controller is configured to provide control signals to at least one of the biasing circuit or the transconductor cell array,
wherein the biasing circuit comprises two or more bias cells in parallel with each other, wherein at least one of the bias cells is selectively activateable via a second control input to alter a bias level produced by the biasing circuit, wherein altering the bias level alters both gain and linearity.

19. A method comprising:
providing a transconductor cell array comprising two or more transconductor cells in parallel with each other, wherein the transconductor cell array is responsive to voltage at an input, wherein the transconductor cell array is configured to generate a differential output current at a first current output and a second current output;

selectively controlling activation of at least one of the transconductor cells to alter the transconductance gain of the transconductor cell array; and controlling a bias level provided to a biasing input node of the transconductor cell array by using a biasing circuit comprising two or more bias cells electrically connected in parallel and to the biasing input of the transconductor cell array, wherein controlling the bias level comprises selectively activating the bias cells such that a magnitude of voltage and/or current at the biasing input node varies in relation to a number of the bias cells that are activated.

20. The method of claim 19, wherein controlling the bias level alters both gain and linearity of the transconductor cell array.

* * * * *